(12) United States Patent
Tseng et al.

(10) Patent No.: US 10,915,135 B2
(45) Date of Patent: Feb. 9, 2021

(54) BUTTON ASSEMBLY

(71) Applicant: Cheng Uei Precision Industry Co., Ltd., New Taipei (TW)

(72) Inventors: Chi-Ming Tseng, New Taipei (TW); Tsung-Shih Lee, New Taipei (TW)

(73) Assignee: CHENG UEI PRECISION INDUSTRY CO., LTD., New Taipei (TW)

(*) Notice: Subject to any disclaimer, the term of this patent is extended or adjusted under 35 U.S.C. 154(b) by 0 days.

(21) Appl. No.: 16/664,940

(22) Filed: Oct. 27, 2019

(65) Prior Publication Data
US 2020/0233447 A1    Jul. 23, 2020

(30) Foreign Application Priority Data
Jan. 21, 2019  (CN) .................... 2019 2 0096688 U

(51) Int. Cl.
| | |
|---|---|
| *G05G 5/05* | (2006.01) |
| *G05G 1/02* | (2006.01) |
| *G05G 5/04* | (2006.01) |
| *G01L 1/14* | (2006.01) |
| *H05K 1/18* | (2006.01) |

(52) U.S. Cl.
CPC ............... *G05G 5/05* (2013.01); *G01L 1/142* (2013.01); *G05G 1/02* (2013.01); *G05G 5/04* (2013.01); *H05K 1/18* (2013.01); *G05G 2505/00* (2013.01); *H05K 2201/10015* (2013.01); *H05K 2201/10151* (2013.01)

(58) Field of Classification Search
CPC .. G05G 5/05; G05G 1/02; G05G 5/04; G05G 2505/00; H05K 1/18; H05K 2201/10015; H05K 2201/10151; H01H 13/705; H01H 13/14; H01H 3/125
USPC ..................................................... 73/862.381
See application file for complete search history.

(56) References Cited

U.S. PATENT DOCUMENTS

| | | | | |
|---|---|---|---|---|
| 5,626,223 | A * | 5/1997 | Lee ......................... | H01H 13/20 200/341 |
| 7,535,454 | B2 * | 5/2009 | Jasso ...................... | G06F 1/1662 345/156 |
| 9,679,713 | B2 * | 6/2017 | Hou ........................ | H01H 13/14 |
| 9,972,461 | B2 * | 5/2018 | Chen ....................... | H01H 13/04 |
| 10,857,453 | B2 * | 12/2020 | Tseng ..................... | A63F 13/218 |
| 2020/0219674 | A1 * | 7/2020 | Lee .......................... | H01H 3/12 |

* cited by examiner

*Primary Examiner* — Octavia Hollington
(74) *Attorney, Agent, or Firm* — Cheng-Ju Chiang

(57) ABSTRACT

A button assembly is disposed in a rocker. The button assembly including a base, a pressure sensor and a keycap. The base has two lower positioning portions with each of the two lower positioning portions protruding outwardly from respective sides of the base. The pressure sensor is mounted on the base. The keycap overlies the pressure sensor. The keycap has two upper positioning portions with each of the two upper positioning portions protruding outwardly from respective sides of the keycap. The two upper positioning portions are individually fixed on each of the two lower positioning portions. As described above, a push-button structure is thus formed by the two lower positioning portions and the two upper positioning portions configured among the base, the pressure sensor and the keycap to achieve the modularization of the button assembly of the present invention.

4 Claims, 6 Drawing Sheets

BUTTON ASSEMBLY

BACKGROUND OF THE INVENTION

1. Field of the Invention

The present invention is submitted based on application no. 201920096688.6 of Jan. 21, 2019 as priority in China, incorporated herein by reference in its entirety.

The present invention generally relates to a button assembly, and more particularly to a button assembly capable of being modularized.

2. Related Art

Conventionally, components of a rocker include a top cover and a pressure sensor. The pressure sensor usually takes advantage of the charge of a pressure sensing element or of a flexible printed circuit (FPC) for operation, which means the harder a user's finger presses, the broader a pressed area is defined. The FPC can sense the pressed area and convert it into numbers which are consequently converted into a value indicating the magnitude of the pressing force. In structure, the top cover has a button. In assembly, the pressure sensor is mounted below the top cover. When in use, the user presses the button and the button is thus pushed downward to contact with a top surface of the pressure sensor, and the pressure sensor is then pushed downward. The pressing operation of the button is completed.

However, a kind of pressure sensor made of soft foam material has been imported. This kind of pressure sensor made of soft foam material has higher sensitivity, which may cause a drastic change in variation of the described value when the button is pressed due to the influence of an accumulated tolerance produced in structure. Furthermore, once the button breaks down, it is hard to determine whether it is resulted from the pressure sensor or other components. Besides, broken components in structure are not easy to be replaced.

Therefore, it is necessary to provide a modularized button assembly to make the pressure sensor made of soft foam material produce less accumulated tolerance during pressing operation and to facilitate component replacement as well as performance detection in structure of the rocker.

SUMMARY OF THE INVENTION

An object of the present invention is to provide a modularized button assembly to overcome the flaws and insufficiency of the conventional button structure.

To attain this, a button assembly is disclosed. The button assembly is disposed in a rocker. The button assembly includes a base, a pressure sensor and a keycap. A middle of the base has an accommodating groove. The base has two lower positioning portions with each of the two lower positioning portions protruding outwardly from respective sides of the base. The pressure sensor is mounted in the accommodating groove of the base. The keycap overlies the pressure sensor. A bottom surface of the keycap has a contact portion. The contact portion is engaged with a top surface of the pressure sensor. The keycap has two upper positioning portions with each of the two upper positioning portions protruding outwardly from respective sides of the keycap. The two upper positioning portions are individually fixed on each of the two lower positioning portions.

Accordingly, each of the two lower positioning portions includes a lower extension part, a flange and a positioning pillar. A side of the base extends outwardly to form the lower extension part. An end of the lower extension part protrudes upwardly to form the flange. The flange further protrudes upwardly to form the positioning pillar.

Accordingly, a middle of each of the two upper positioning portions has at least a hollow area. The hollow areas of the two upper positioning portions allow the two upper positioning portions to be bendable upwardly and downwardly under stress as flexible elastic arms. Each of the two upper positioning portions has a location hole. Individually, the two location holes of the two upper positioning portions downwardly receives each of the two positioning pillars.

Accordingly, the pressure sensor includes a sensor element made of soft material. The contact portion of the keycap is engaged with a top surface of the sensor element.

Accordingly, an outer edge of the base has a plurality of stop blocks. The plurality of the stop blocks extend upwardly to form the accommodating groove therebetween on the middle of the base.

As described above, a push-button structure is thus formed by the two lower positioning portions and the two upper positioning portions configured among the base, the pressure sensor and the keycap to achieve the modularization of the button assembly of the present invention. When a user presses the button assembly of the present invention, the keycap is utilized to transmit pressure to the pressure sensor, which generates less accumulated tolerance compared to conventional button structure. Also, the modularized structure of the present invention is beneficial to the assembly into other compatible carriers as well as convenient for replacement.

DESCRIPTION OF THE PREFERRED EMBODIMENTS

Figure 1:
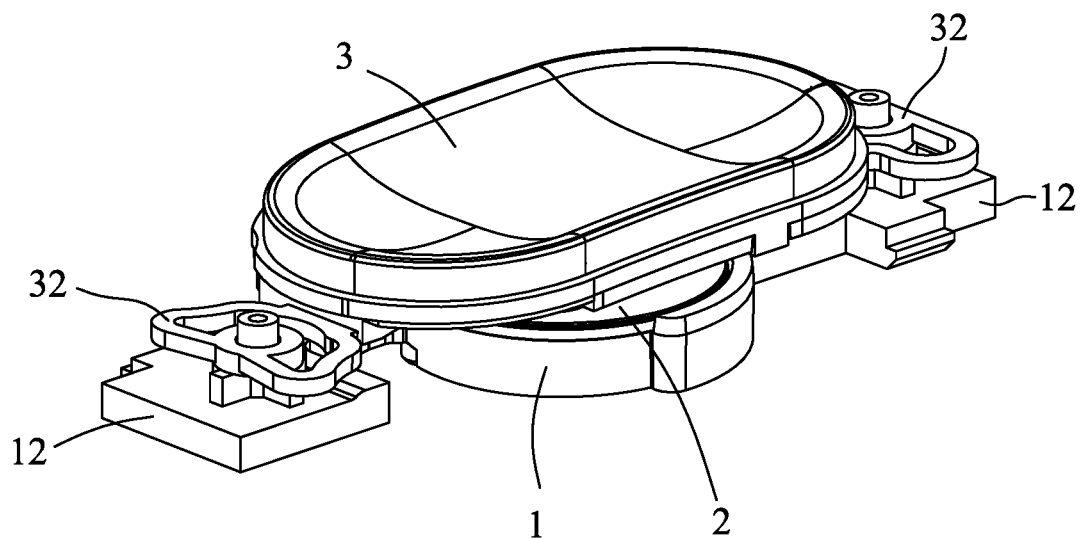
FIG. 1 is a perspective view of button assembly in accordance with the present invention.
Figure 2:
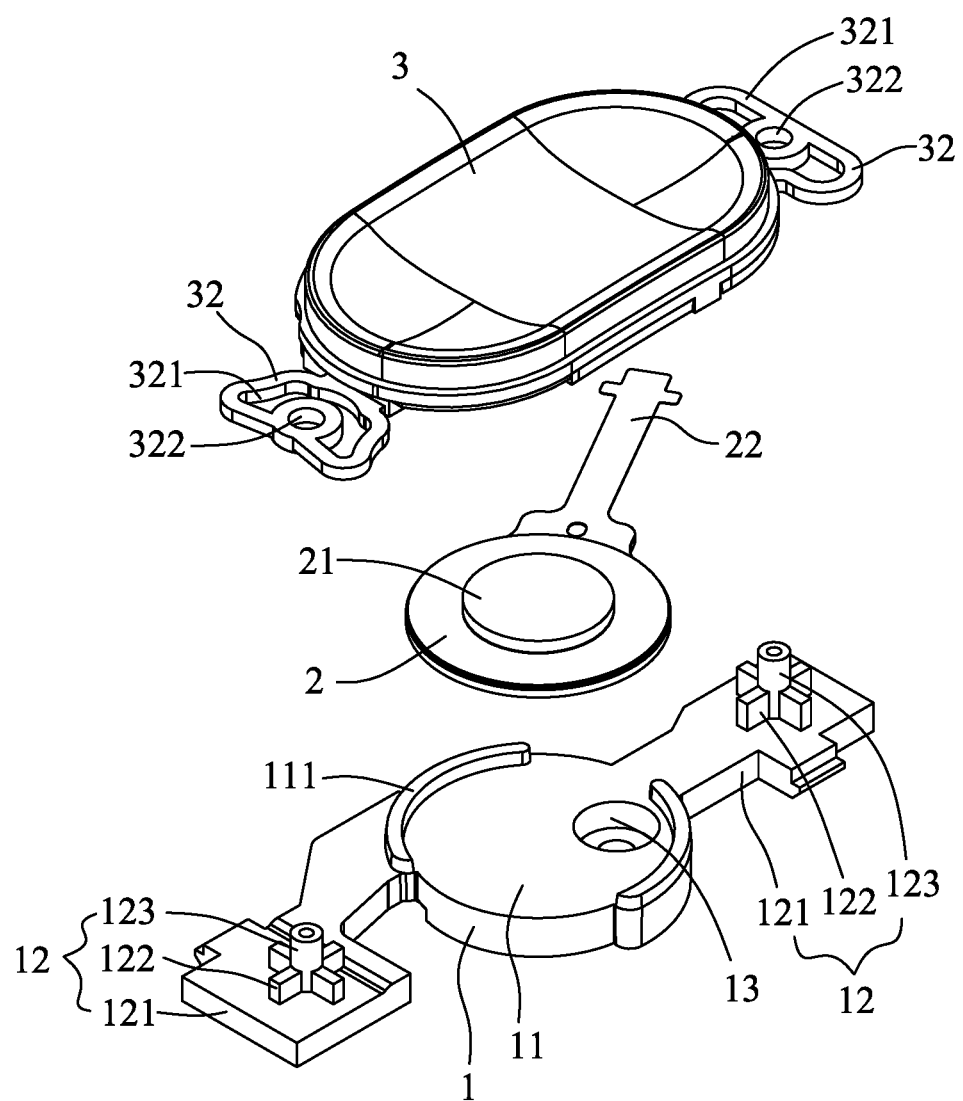
FIG. 2 is an exploded perspective view of FIG. 1.
Figure 3:
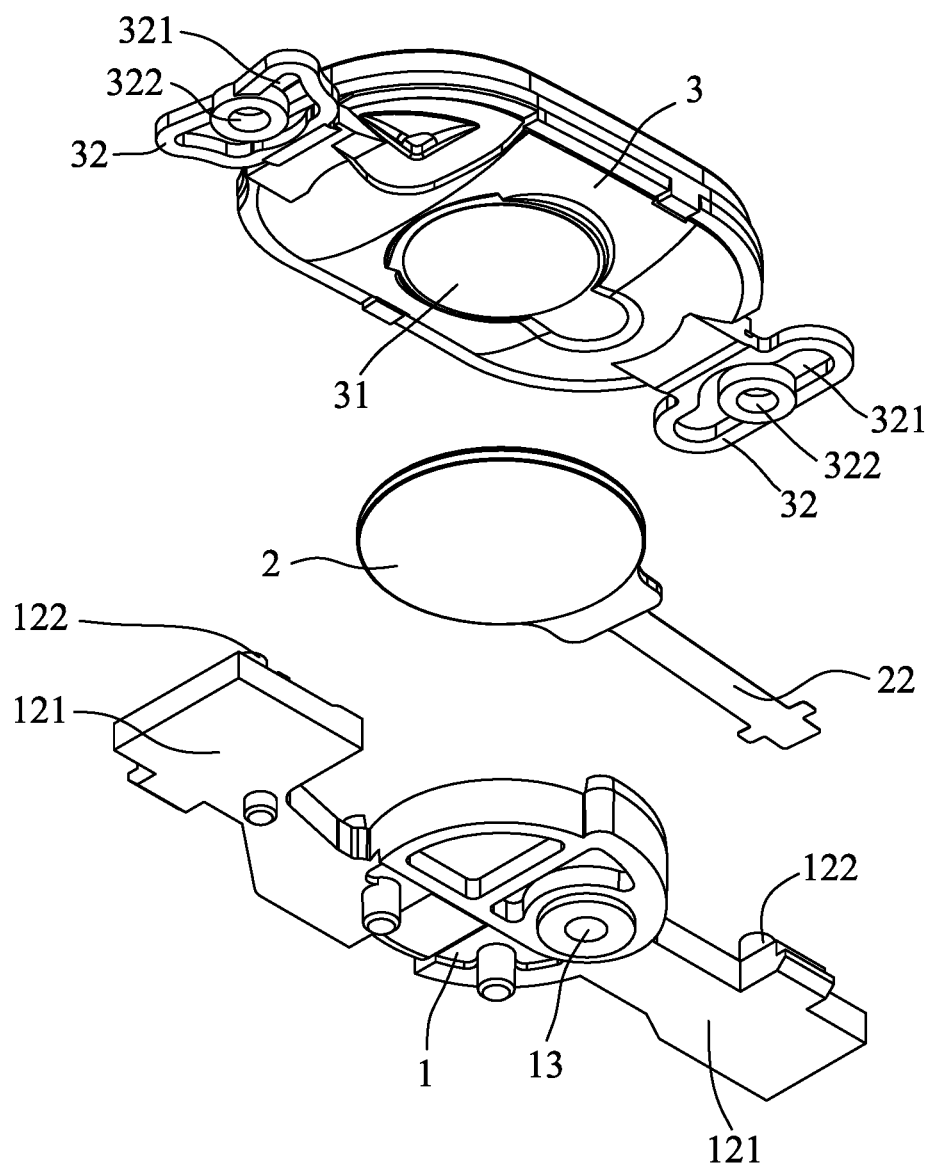
FIG. 3 is an exploded perspective view of FIG. 2 at a different view angle.

Referring to FIG. 1 to FIG. 3, a button assembly 100 in accordance with the present invention includes a base 1, a pressure sensor 2 and a keycap 3. An outer edge of the base 1 has a plurality of stop blocks 111. The plurality of the stop blocks 111 extend upwardly to form an accommodating groove 11 therebetween on a middle of the base 1. The base 1 has two lower positioning portions 12 with each of the two lower positioning portions 12 protruding outwardly from respective sides of the base 1. Each of the two lower positioning portions 12 includes a lower extension part 121, a flange 122 and a positioning pillar 123. A side of the base 1 extends outwardly to form the lower extension part 121. An end of the lower extension part 121 protrudes upwardly to form the flange 122. The flange 122 further protrudes upwardly to form the positioning pillar 123. A positioning hole 13 penetrating longitudinally throughout the base 1 is formed.

The pressure sensor 2 is mounted in the accommodating groove 11 of the base 1 surrounded by the plurality of the stop blocks 111. The pressure sensor 2 includes a sensor element 21 made of soft material. The pressure sensor 2 extends outwardly to form a first capacitor 22.

With reference to FIG. 2 and FIG. 3, the keycap 3 overlies the pressure sensor 2. A bottom surface of the keycap 3 has a contact portion 31. The contact portion 31 is engaged with a top surface of the sensor element 21 made of soft material. The keycap 3 has two upper positioning portions 32 with each of the two upper positioning portions 32 protruding outwardly from respective sides of the keycap 3. The two upper positioning portions 32 are individually fixed on each of the two lower positioning portions 12. The two upper positioning portions 32 are both elliptical and made of plastic material. A middle of each of the two upper positioning portions 32 has at least a hollow area 321. The hollow areas 321 of the two upper positioning portions 32 allow the two upper positioning portions 32 to be bendable upwardly and downwardly under stress as flexible elastic arms. Each of the two upper positioning portions 32 has a location hole 322. Individually, the two location holes 322 of the two upper positioning portions 32 downwardly receives each of the two positioning pillars 123.

The button assembly 100 of the present invention utilizes the sensor element 21 that is made of soft material. The sensor element 21 made of soft material makes the pressure sensor 2 have higher detective sensitivity than the flexible printed circuit (FPC) and the pressure sensing element, which may easily cause a drastic change in variation of the value associated with magnitude of the pressing force during the time that the pressure sensor 2 is pressed. In this regard, the button assembly 100 of the present invention provides the pressure sensor 2 configured between the base 1 and the keycap 3. When a user presses the button assembly 100 of the present invention, the keycap 3 moves downwardly along with the pressing path and drives the two upper positioning portions 32 to moves downwardly, as a way of the keycap 3 being pressed. Because the location holes 322 of the two upper positioning portions 32 are respectively fixed on each of the two positioning pillars 123, during being pressed down, sides of the two upper positioning portions 32 fixed with the two positioning pillars 123 are not movable and only portions of the two upper positioning portions 32 adjacent to the keycap 3 can be moved downwardly, which allows an elastic transformation of the two upper positioning portions 32. At the same time, the two upper positioning portions 32 generate a rebound force which tends to move the two upper positioning portions 32 upwardly again. When the user releases the button assembly 100 of the present invention, the rebound force produced at the spots of the two upper positioning portions 32 under elastic transformation is for moving the portions of the two upper positioning portions 32 adjacent to the keycap 3 upwardly to eventually bring the keycap 3 moving upwardly and the keycap 3 returns to its original state. One pressing operation is done.

Figure 4:
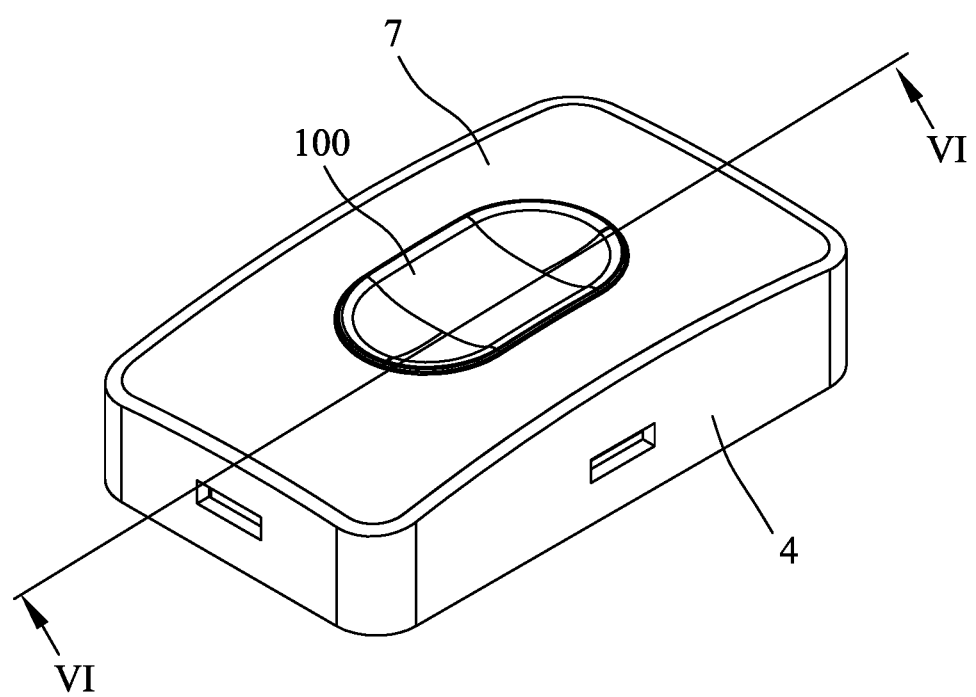
FIG. 4 is a perspective view of a rocker configured with the button assembly of the present invention.
Figure 5:
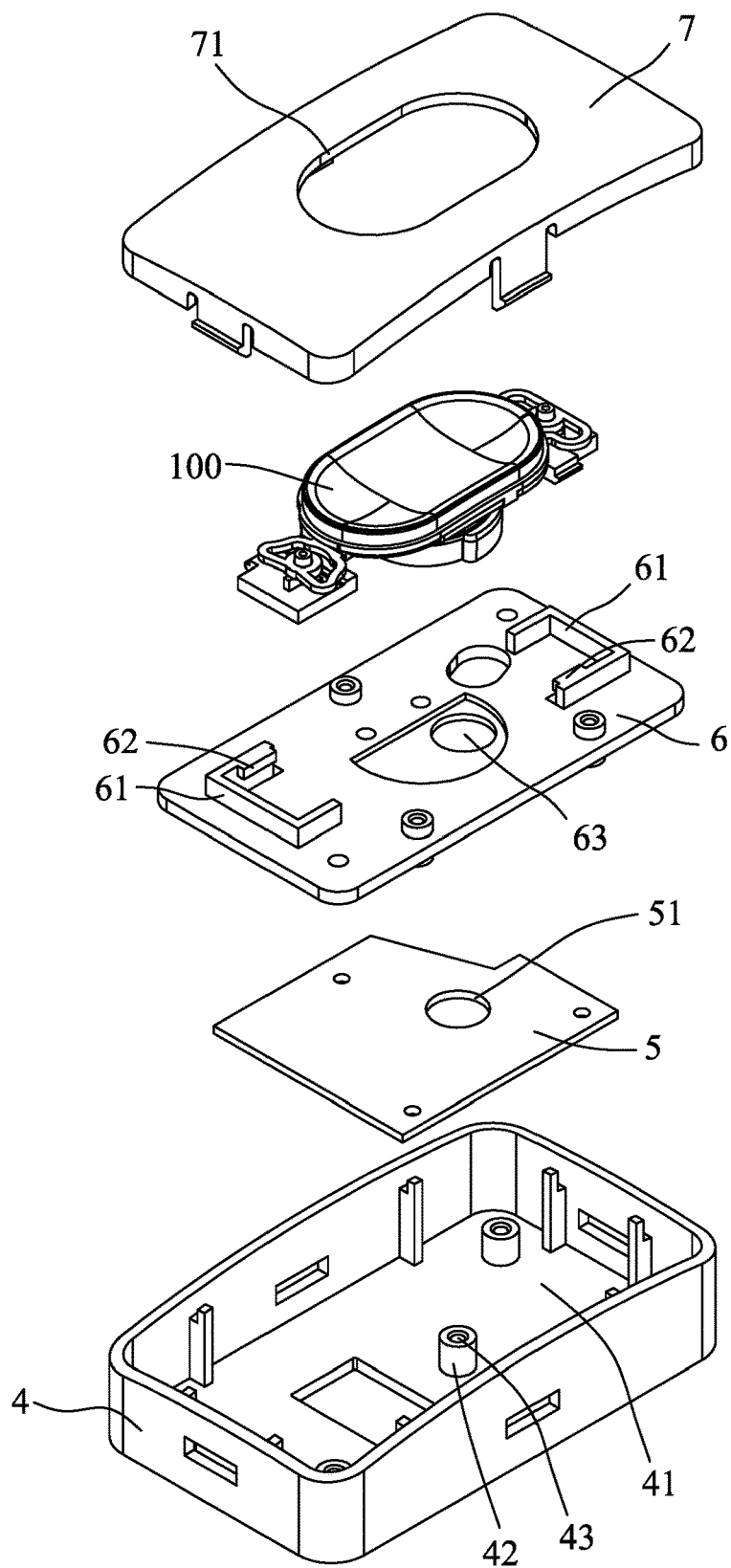
FIG. 5 is an exploded perspective view of FIG. 4.
Figure 6:
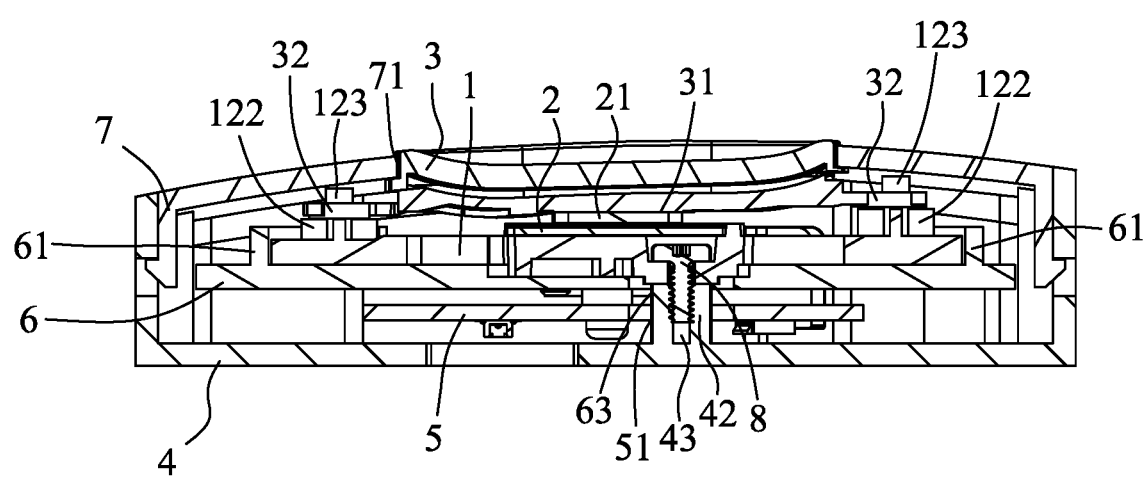
FIG. 6 is a cross-sectional view taken along lines VI-VI of FIG. 4.

With reference to FIG. 4 to FIG. 6, a rocker 200 configured with the button assembly 100 of the present invention is disclosed. The rocker 200 includes an outer shell 4, circuit board 5, a fixed panel 6 and a top cover 7.

The outer shell 4 has an inner space 41. The circuit board 5 and the fixed panel 6 are disposed in the inner space 41. A bottom of the outer shell 4 protrudes upwardly to form a bump 42. A center of the bump 42 is recessed downwardly to form a fixed groove 43. The fixed groove 43 is disposed corresponding to the positioning hole 13 of the base 1 of the button assembly 100.

The circuit board 5 is disposed in the outer shell 4. The circuit board 5 has a first communication opening 51. The first communication opening 51 receives the bump 42 downwardly. The circuit board 5 has a second capacitor (not shown). The fixed panel 6 is disposed above the circuit board 5 and in the outer shell 4. The fixed panel 6 protrudes upwardly to form two limiting walls 61. Each of the two limiting walls 61 has a U shape and forms an opening space. The opening spaces of the two limiting walls 61 are facing each other and are corresponding to the two lower positioning portions 12. An upper edge of each of the two limiting walls 61 protrudes toward the opening space to form a protrusion 62. The fixed panel 6 has a second communication opening 63. The second communication opening 63 corresponds the first communication opening 51 and receives the bump 42 downwardly. The top cover 7 is disposed on the outer shell 4 and covers on the circuit board 5 and the fixed panel 6. The top cover 7 has an opening 71 corresponding to the button assembly 100 of the present invention.

The button assembly 100 of the present invention is configured in the rocker 200. The fixed groove 43 corresponds to the positioning hole 13 of the base 1 of the button assembly 100. A positioning element 8 is provided to pass through the fixed groove 43 and the positioning hole 13 for fixation. The first capacitor 22 is electrically connected to the second capacitor. The two lower positioning portions 12 are respectively disposed inside each of the two limiting walls 61, and the protrusions 62 of the two limiting walls 61 are located above the two lower positioning portions 12, so as to restrict movement of the two lower positioning portions 12, thereby the base 1 can be positioned on the fixed panel 6. The top cover 7 is mounted on the outer shell 4 and covers on the configured circuit board 5, the fixed panel 6 and the button assembly 100 of the present invention with the keycap 3 exposing upwardly from the opening 71, as a way of the configuration of the button assembly 100 of the present invention in the rocker 200.

The button assembly 100 of the present invention integrates the pressure sensor 2 and the keycap 3 to be a unit component, capable of being mounted in any compatible carriers, therefore not limited within the disclosure of the embodiment of the present invention.

As described above, a push-button structure is thus formed by the two lower positioning portions 12 and the two upper positioning portions 32 configured among the base 1, the pressure sensor 2 and the keycap 3 to achieve the modularization of the button assembly 100 of the present invention. When a user presses the button assembly 100 of the present invention, the keycap 3 is utilized to transmit pressure to the pressure sensor 2, which generates less accumulated tolerance compared to conventional button structure. Also, the modularized structure of the present invention is beneficial to the assembly into other compatible carriers as well as convenient for replacement.

What is claimed is:

1. A button assembly, disposed in a rocker, the button assembly including a base, a pressure sensor and a keycap, a middle of the base having an accommodating groove, the base having two lower positioning portions with each of the two lower positioning portions protruding outwardly from respective sides of the base, the pressure sensor being mounted in the accommodating groove of the base, the keycap overlying the pressure sensor, a bottom surface of the keycap having a contact portion, the contact portion being engaged with a top surface of the pressure sensor, the keycap having two upper positioning portions with each of the two upper positioning portions protruding outwardly from respective sides of the keycap, the two upper positioning portions being individually fixed on each of the two lower positioning portions;

wherein each of the two lower positioning portions includes a lower extension part, a flange and a positioning pillar, a side of the base extends outwardly to form the lower extension part, an end of the lower extension part protrudes upwardly to form the flange, the flange further protrudes upwardly to form the positioning pillar;

wherein a middle of each of the two upper positioning portions has at least a hollow area, the hollow areas of the two upper positioning portions allow the two upper positioning portions to be bendable upwardly and downwardly under stress as flexible elastic arms, each of the two upper positioning portions has a location hole, individually, the two location holes of the two upper positioning portions downwardly receives each of the two positioning pillars.

2. The button assembly of claim 1, wherein the pressure sensor includes a sensor element made of soft material, the contact portion of the keycap is engaged with a top surface of the sensor element.

3. The button assembly of claim 1, wherein an outer edge of the base has a plurality of stop blocks, the plurality of the stop blocks extend upwardly to form the accommodating groove therebetween on the middle of the base.

4. A button assembly, disposed in a rocker, the button assembly including a base, a pressure sensor and a keycap, a middle of the base having an accommodating groove, the base having two lower positioning portions with each of the two lower positioning portions protruding outwardly from respective sides of the base, the pressure sensor being mounted in the accommodating groove of the base, the keycap overlying the pressure sensor, a bottom surface of the keycap having a contact portion, the contact portion being engaged with a top surface of the pressure sensor, the keycap having two upper positioning portions with each of the two upper positioning portions protruding outwardly from respective sides of the keycap, the two upper positioning portions being individually fixed on each of the two lower positioning portions;

wherein each of the two lower positioning portions includes a lower extension part, a flange and a positioning pillar, a side of the base extends outwardly to form the lower extension part, an end of the lower extension part protrudes upwardly to form the flange, the flange further protrudes upwardly to form the positioning pillar.

\* \* \* \* \*